(12) United States Patent
Hayashi et al.

(10) Patent No.: US 11,243,856 B1
(45) Date of Patent: Feb. 8, 2022

(54) FRAMING PROTOCOL SUPPORTING LOW-LATENCY SERIAL INTERFACE IN AN EMULATION SYSTEM

(71) Applicant: CADENCE DESIGN SYSTEMS, INC., San Jose, CA (US)

(72) Inventors: Yuhei Hayashi, San Jose, CA (US); Mitchell G. Poplack, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 542 days.

(21) Appl. No.: 16/217,465

(22) Filed: Dec. 12, 2018

(51) Int. Cl.
*G06F 11/22* (2006.01)
*G06F 11/273* (2006.01)
*G06F 30/331* (2020.01)
*G06F 9/455* (2018.01)
*H04L 29/08* (2006.01)

(52) U.S. Cl.
CPC .......... *G06F 11/221* (2013.01); *G06F 9/455* (2013.01); *G06F 11/2733* (2013.01); *G06F 30/331* (2020.01); *H04L 67/08* (2013.01)

(58) Field of Classification Search
CPC ...... G06F 11/221; G06F 9/455; G06F 30/331; G06F 11/2733; H04L 67/08
See application file for complete search history.

(56) References Cited

U.S. PATENT DOCUMENTS 5,559,963 A * 9/1996 Gregg ............... H04J 3/0629
709/234
5,960,191 A * 9/1999 Sample ........... G01R 31/31717
703/28

OTHER PUBLICATIONS

S. Koschik, F. Adler, D. Szepanski and R. W. De Doncker, "Scalable FPGA and DSP based control for multiphase concentrated winding permanent magnet machines with single coil integrated inverters," 2015 IEEE International Electric Machines & Drives Conference (IEMDC), 2015, pp. 1515-1521. (Year: 2015).*

* cited by examiner

*Primary Examiner* — Saif A Alhija
(74) *Attorney, Agent, or Firm* — Foley & Lardner LLP

(57) ABSTRACT

Using a framing protocol, an application specific integrated circuit (ASIC) in an emulation system may transmit a start-of-packet molecule to a serializer-deserializer (SerDes) interface of a switching ASIC in a gap cycle leading up to an emulation cycle such that the switching ASIC may start routing mission data through the SerDes interface during the emulation cycle. The ASIC may transmit an end-of-packet molecule at a first gap cycle to the SerDes interface of the switching ASIC such that the switching ASIC may stop routing data through the SerDes interface during the gap cycles. The start-of-packet molecule may include a start-of-packet word, a status word, cyclic redundancy check word, and an idle word. The end-of-packet molecule may include an end-of-packet word, a status word, a cyclic redundancy check word, and an idle word.

20 Claims, 6 Drawing Sheets

600

100

200

600

FRAMING PROTOCOL SUPPORTING LOW-LATENCY SERIAL INTERFACE IN AN EMULATION SYSTEM

TECHNICAL FIELD

This application is generally directed towards processor based emulation systems and specifically towards a framing protocol to indicate gap cycles and emulation cycles to serial interfaces of processor based emulation systems.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. A significant function of EDA tools is emulation of a user's logical system (e.g., an IC design) to perform pre-silicon functional verification, firmware and software development, and post-silicon debug. To achieve this, a typical processor-based emulation system comprises several Application Specific Integrated Circuits (ASICs), often referred to as emulation ASICs or emulation chips, all working together to execute a program generated by an emulation compiler generated from the user's IC design. The compiled program models a design under test (DUT) that is a logical representation of the user's IC design running on the several emulation ASICs of the emulation system.

Emulation ASICs may communicate with each other communication links such as copper traces carrying data in a circuit board or optical cables carrying data across circuit boards. The communication links often carry serialized data although the data may be generated and/or consumed in parallel. Therefore, an input/output (I/O) interface at a transmit side may serialize parallel data prior to transmission and another I/O interface at a receive side may parallelize received serial data.

An emulation system may execute emulation cycles where portions of the DUT are emulated to generate mission data or emulation data. Different ASICs in the emulation system may have to communicate the mission data or the emulation data with each other. For example, a first set of ASICs may be emulating a first portion of the DUT during the emulation cycles and the mission data generated from the first portion of the DUT may have to be communicated to a second set of ASICs emulating a second portion of the DUT. The corresponding I/O interfaces may perform serialization-deserialization to facilitate the communication between the ASICs. In addition to the emulation cycles, the emulation system may have gap cycles. In a gap cycle, the emulation system may not be emulating the DUT and may not produce mission data. The generated non-mission data may not have to be communicated between the ASICs.

The I/O interfaces and switching logic of conventional emulation systems cannot distinguish between the mission data and non-mission data. Therefore, conventional emulation systems continue to route non-mission and useless data when the emulation systems are idle running gap cycles. These operations on non-mission data waste processing resources and consume unnecessary power. Furthermore, distinguishing the mission data from the gap data may be necessary such that the data can be consumed by the appropriate resource at the receiving end of the connection.

SUMMARY

What is therefore desired are systems and methods that enable a framing protocol providing respective combination of data packets to I/O interfaces of switching ASICs in an emulation system indicating emulation cycles and gap cycles.

Embodiments disclosed herein solve the aforementioned technical problems and may provide other technical benefits as well. Using a framing protocol, an ASIC in an emulation system may transmit a start-of-packet molecule to a serializer-deserializer (SerDes) interface of a switching ASIC in a gap cycle leading up to an emulation cycle such that the switching ASIC may start routing mission data through the SerDes interface during the emulation cycle. The ASIC may transmit an end-of-packet molecule at a first gap cycle to the SerDes interface of the switching ASIC such that the switching ASIC may stop routing data through the SerDes interface during the gap cycles. The start-of-packet molecule may include a start-of-packet word, a status word, cyclic redundancy check word, and an idle word. The end-of-packet molecule may include an end-of-packet word, a status word, a cyclic redundancy check word, and an idle word.

In an embodiment, an emulation system comprises a first chip configured to route data from a second chip to a set of chips; the second chip configured to: transmit an end-of-packet molecule to the first chip at the beginning of a first gap cycle of the emulation system; transmit a start-of-packet molecule to the first chip at the beginning of a second gap cycle of the emulation system; the first chip further configured to: stop routing data to the set of chips in response to receiving the end-of-packet molecule; and resume routing data to the set of chips in response to receiving the start-of-packet molecule.

In another embodiment, an emulation method comprises transmitting, by a second chip to a first chip, an end-of-packet molecule at a first gap cycle of an emulation system; stopping, by the first chip, routing of data from the second chip to a set of chips in response to receiving the end-of-packet molecule; transmitting, by the second chip to the first chip, a start-of-packet molecule at a second gap cycle of the emulation system; and resuming, by the first chip, routing of data from the second chip to the set of chips in response to receiving the start-of-packet molecule.

BRIEF DESCRIPTION OF THE DRAWINGS

The accompanying drawings constitute a part of this specification and illustrate an embodiment of the subject matter described herein.

DETAILED DESCRIPTION

Figure 1:
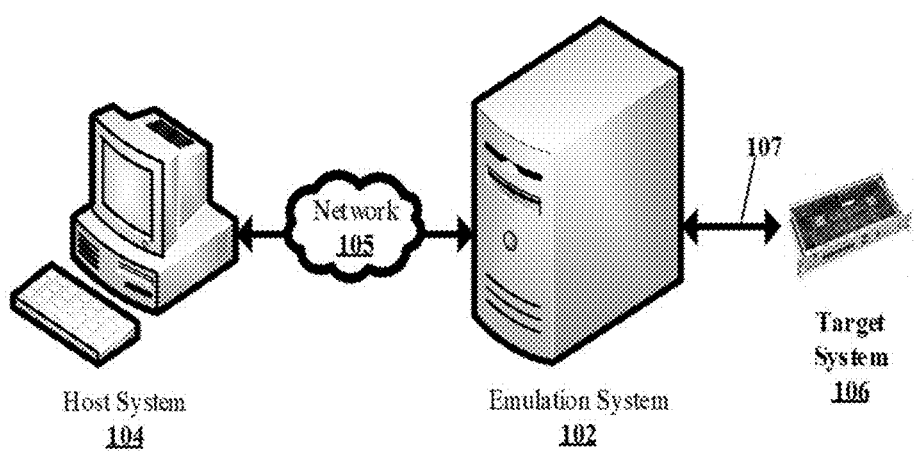
FIG. 1 shows an illustrative environment including an emulation system, according to an embodiment.

Embodiments disclosed herein describe systems and methods enabling framing protocols to indicate gap cycles and emulation cycles in an emulation system. A switching ASIC (also referred to as switching chip) in an emulation system may have multiple SerDes interfaces where each SerDes interface may receive/transmit data from different emulation processes. Therefore, the switching ASIC may be handling a number of emulation processes as opposed to an emulation ASIC that may be executing a single process. As the emulation ASICs (also referred to as emulation chips) may be executing their respective processes, a sequencer of the emulation system may provide a signal to the emulation ASICs to begin, stop, and/or resume execution of the respective processes. For example, the sequencer may use a signal such as a synchronization signal. The sequencer may assert the synchronization signal during an emulation cycle to cause the emulation ASICs to start or resume the execution of their respective processes. The sequencer may de-assert the synchronization signal during a gap cycle to cause the ASICs to stop execution of their respective processes.

However, as a switching ASIC may be handling multiple processes with each SerDes interface handling a separate process, a single synchronization signal may not be sufficient to indicate the switching ASIC to stop or resume different processes. Each of the processes and therefore each of the SerDes interface may have to be controlled separately. More specifically, each SerDes interface may have to receive synchronization data packets from a corresponding ASIC in communication with the SerDes interface. Based on the synchronization data packets, the switching ASIC may select between routing and not routing of the data through the corresponding SerDes interfaces.

The framing protocol disclosed herein may include a combination of data packets to indicate start of emulation cycles (or end of gap cycles) and end of emulation cycles (or start of gap cycles). Using the framing protocol, an ASIC in an emulation system may transmit a start-of-packet molecule to a serializer-deserializer (SerDes) interface of a switching ASIC in a gap cycle leading up to an emulation cycle such that the switching ASIC may start routing mission data through the SerDes interface during the emulation cycle. The ASIC may transmit an end-of-packet molecule at a first gap cycle to the SerDes interface of the switching ASIC such that the switching ASIC stops routing data through the SerDes interface during the gap cycles. The start-of-packet molecule may include a start-of-packet word, a status word, cyclic redundancy check word, and an idle word. The end-of-packet molecule may include an end-of-packet word, a status word, a cyclic redundancy check word, and an idle word.

Therefore, using the framing protocol, the emulation system may configure the switching ASIC to perform different operations on data through different SerDes interfaces. If the data includes mission data, the switching ASIC may be configured to route the mission data. If the data includes non-mission or useless data, the switching ASIC may be configured not to route the mission data. It may be possible for each lane to provide for appropriate interpretation of the sequence of mission data at each receiving end of each link and the mission data can be aligned in time to the needs of the receiving ASIC and consumed correctly.

FIG. 1 shows an illustrative environment 100 of an emulation system enabling a framing protocol supporting low-latency serial interfaces. The illustrative environment 100 may comprise a host system 104, an emulation system 102, a target system 106, a network 105, and a connection 107. The host system 104 may include one or more workstations that may run debug and runtime software interacting with the emulation system 102. The workstations may be any type of computing devices such as desktop computers, laptop computers, tablet computers, and smartphones. The emulation system 102 may a combination of hardware and software modules which may emulate a design under test (DUT). The emulation system 102 may include clusters of interconnected ASICs, non-transitory memory devices, buffers, data storage devices configured to provide a system platform for emulating the DUT. The clusters may be arranged in multiple boards. The boards may be arranged within multiple racks. Multiple racks may be arranged in a plurality of emulation of devices, which may be analogous to multi-rack servers. The target system 106 may comprise hardware and/or software modules configured to interact with the DUT being emulated. For example, if the DUT is a design of a graphics processing unit (GPU), the target system 106 may be a motherboard configured to receive the GPU after fabrication. The target system 106 may be an external hardware environment provided by the user.

The network 105 may be any kind of communication link facilitating communication between the host system 104 and the emulation system 102. For example, the network 105 may a local area network may include a local area network (LAN), metropolitan area network (MAN), wide area network (WAN), and/or the Internet. The connection 107 may be also be any kind of communication link configured to facilitate a communication with the emulation system 102 and the target system 106.

The above described systems 102, 104, 106 of the environment 100 are merely illustrative and other configuration should be considered to be within the scope of this disclosure. For example, the network 105 may include a local connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 104 using a remote access protocol such as internet protocol (IP).

Figure 2:
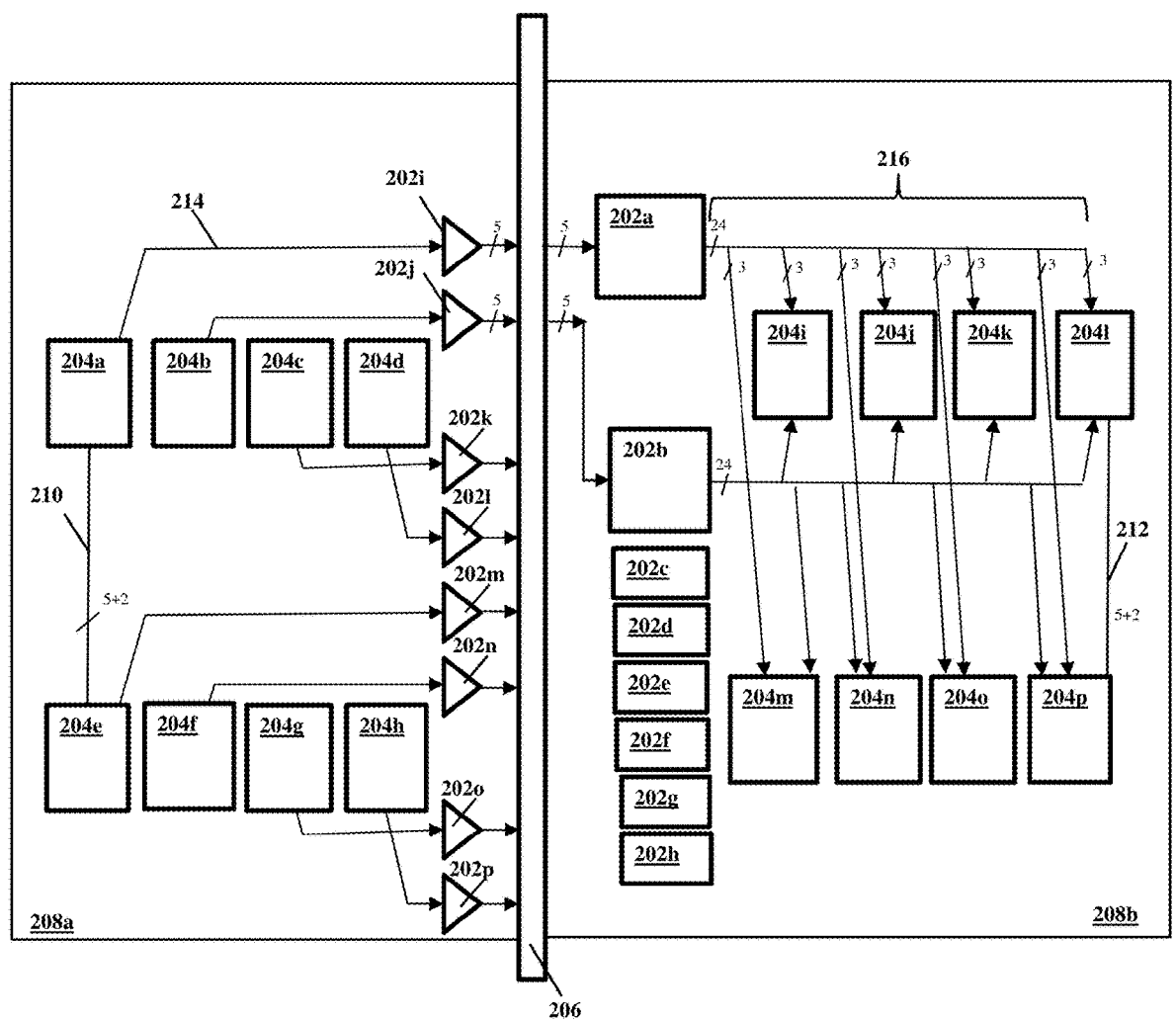
FIG. 2 shows an illustrative emulation circuit containing a plurality of ASICs, according to an embodiment.

FIG. 2 shows an illustrative emulation circuit 200 in an emulation system (e.g., emulation system 102 shown in FIG. 1). As shown, the emulation circuit 200 may include a plurality of emulation ASICs 204a-204p (collectively or commonly referred to as 204) and a plurality of switching ASICs 202a-202p (collectively or commonly referred to as 202. An emulation ASIC 204 may be any computational unit to perform logic computation for the purpose of emulation, simulation, and/or prototyping of logic systems and may include Boolean-processor-based-systems, field programmable gate arrays (FPGAs), or the like. A first set of emulation ASICs 204a-204h may be arranged within a first logic board (also referred to as logic drawer) 208a and a second set of emulation ASICs 204i-204p may be arranged within a second logic board 208b. The first logic board 208a and the second logic board 208b may be interconnected to each other through a backplane 206. The backplane 206 may provide connectors and/or slots to connect or dock the logic boards 208a, 208b.

The first set of emulation ASICs 204a-204h may be connected to each other through a plurality of on-board connections (an illustrative on-board connection 210 shown for reference) on the first logic board 208a. The on-board connections (also referred to as board-level interconnects) may be, for example, copper traces connecting the first set of emulation ASICs 204a-204h to each other. In an embodiment, each on-board connection between a pair of ASICs 204 may provide seven data lanes, five SerDes lanes and two low-latency lanes. For example, the on-board connection 210 between emulation ASICs 204a, 204e may include five SerDes lanes and two low-latency lanes connecting the emulation ASICs 204a, 204e. The five SerDes lanes of the on-board connection 210 may, in some instances, operate at six gigabits per second (Gbps). The two low-latency lanes of the on-board connection 210, in some instances, operate at two Gbps. Similarly, the second set of emulation ASICs 204i-204p may be connected to each other through a plurality of on-board connections (an illustrative on-board connection 212 is shown for reference). The on-board connection 212 in the second logic board 208b may be similar to the on-board connection 210 of the first logic board 208a.

The configuration of a pair of logic boards 208a, 208b connected through a backplane 206 is merely for illustration. Other logic boards (not shown) may be connected to the backplane 206. In an illustrative embodiment, six logic boards (including the logic boards 208a, 208b) may be connected through the backplane forming a logic cluster. Therefore, there may be forty-eight emulation ASICs (including emulation ASICs 204) in one logic cluster.

Each emulation ASIC in each logic board may be connected at least one switching ASIC in other logic boards of the same logic cluster through the backplane 206. For example, the emulation ASIC 204a in the first logic board 208a may be connected to a switching ASIC 202 in the second logic board through the backplane 206. An interconnect 214 between the emulation ASIC 204a and the switching ASIC 202a may include five lanes to drive five signals into the backplane 206 and then to the switching ASIC 202a. In some embodiments, the emulation circuit 200 may be configured to utilize four lanes out of the five lanes in the interconnect 214. One of the five lanes in the interconnect 214 may be reserved to relocate a signal from a bad or faulty lane to the reserve lane. Such reservation may be applied to other interconnects through the backplane 206 in the emulation circuit 206. The interconnect 214, in some instances, may be formed by copper traces in the backplane 206, the first logic board 208a, and/or the second logic board 208b. A switching ASIC 202i connected to the emulation ASIC 204a may provide a pass-through passage to the signals driven by the emulation ASIC 204a through the interconnect 214 to the backplane 206. For instance, the switching ASIC 202i may have a pair of pins (not shown): (i) input pins to receive signals from the interconnect 214 and (ii) output pins to drive the received signals into the backplane 206. The interconnect 214 may be connected to the switching ASIC 202a in the second logic board 208b through switching ASIC 202i on the first logic board 208a and the backplane 206.

Each switching ASIC in each logic board may receive signals through the backplane 206 from at least one emulation ASIC in other logic boards of the logic cluster and provide those signals to each emulation ASIC in the logic board. For example, the switching ASIC 202a may receive signals through the interconnect 214 from the emulation ASIC 204a. Continuing with the illustrative embodiment of a signal cluster with six logic boards, the switching ASIC 202 may receive signals through five-line interconnects from an emulation ASIC from other five logic boards connected to the backplane 206. Therefore, in addition to the five-lane interconnect 210, the switching ASIC 202a may have other four five-lane interconnects (not shown) for incoming signals from the respective emulation ASICs. Therefore, there may be twenty-five incoming lanes to the switching ASIC 202a.

The switching ASIC 202a may provide a single-bit dynamic multiplexing and routing of data coming from the incoming twenty five lanes and provide the multiplexed and routed data to the emulation ASICs 204i-204p through the interconnects 216. In some instances, the interconnects 216 may be formed by copper traces in the backplane 206 and/or the second logic board 208b. As shown, the switching ASIC 202a may have 24 outgoing lanes in the interconnects 216, with three lanes to each of the emulation ASICs 204i-204p. Analogous to the switching ASIC 202a, another switching ASIC 202b may receive twenty five incoming signals through the backplane 206 from twenty five incoming lanes including five signals from an emulation ASIC 204b. After performing single-bit dynamic multiplexing and routing of the incoming data, the switching ASIC 202b may provide the routed and multiplexed to any of the emulation ASICs 204i-204p through twenty four outgoing lanes from the switching ASIC 202b with three lanes assigned to each of the emulation ASICs 204i-204p.

Each of the emulation ASICs 204a-204h in the first logic board 208a can transmit data to any of the emulation ASICs 204i-204p in the second logic board 208b by the use of the switching ASICs 202a-202h. The switching ASICs 202a-202h may route a single bit transmitted from any of the emulation ASICs 204a-204h in the first logic board to any of the emulation ASICs 204i-204p in the second logic board 208b. Therefore, within the cluster containing the logic boards 208a, 208b, the switching ASICs (including the switching ASICs 202a-202h) may route a single-bit from any emulation ASIC in any board to any emulation ASIC to any of the other boards. This flexibility is a significant improvement upon conventional systems using fixed and limited number of backplane connections.

Although FIG. 2 shows switching ASICs 202a-202h in the second logic board 208b and the switching ASICs 202i-202p are in the first logic board 206, one or more of the switching ASICs 202a-202p may be located within the backplane 206.

Embodiments disclosed herein configure the switching ASICs 202 to route mission data during emulation cycles and not to route mission data during gap cycles. Using a framing protocol, an emulation ASIC 204 or a switching ASIC 202 may transmit an end-of-packet molecule to a SerDes interface of a switching ASIC 202 such the switching ASIC 202 may stop routing of the data through the SerDes interface in response to receiving the end-of-packet molecule. Furthermore, an emulation ASIC 204 or a switching ASIC 202 may transmit a start-of-packet molecule to the SerDes interface of the switching ASIC 202 such that the switching ASIC 202 may resume routing of data through the SerDes interface in response to receiving the start-of-packet molecule.

Figure 3:
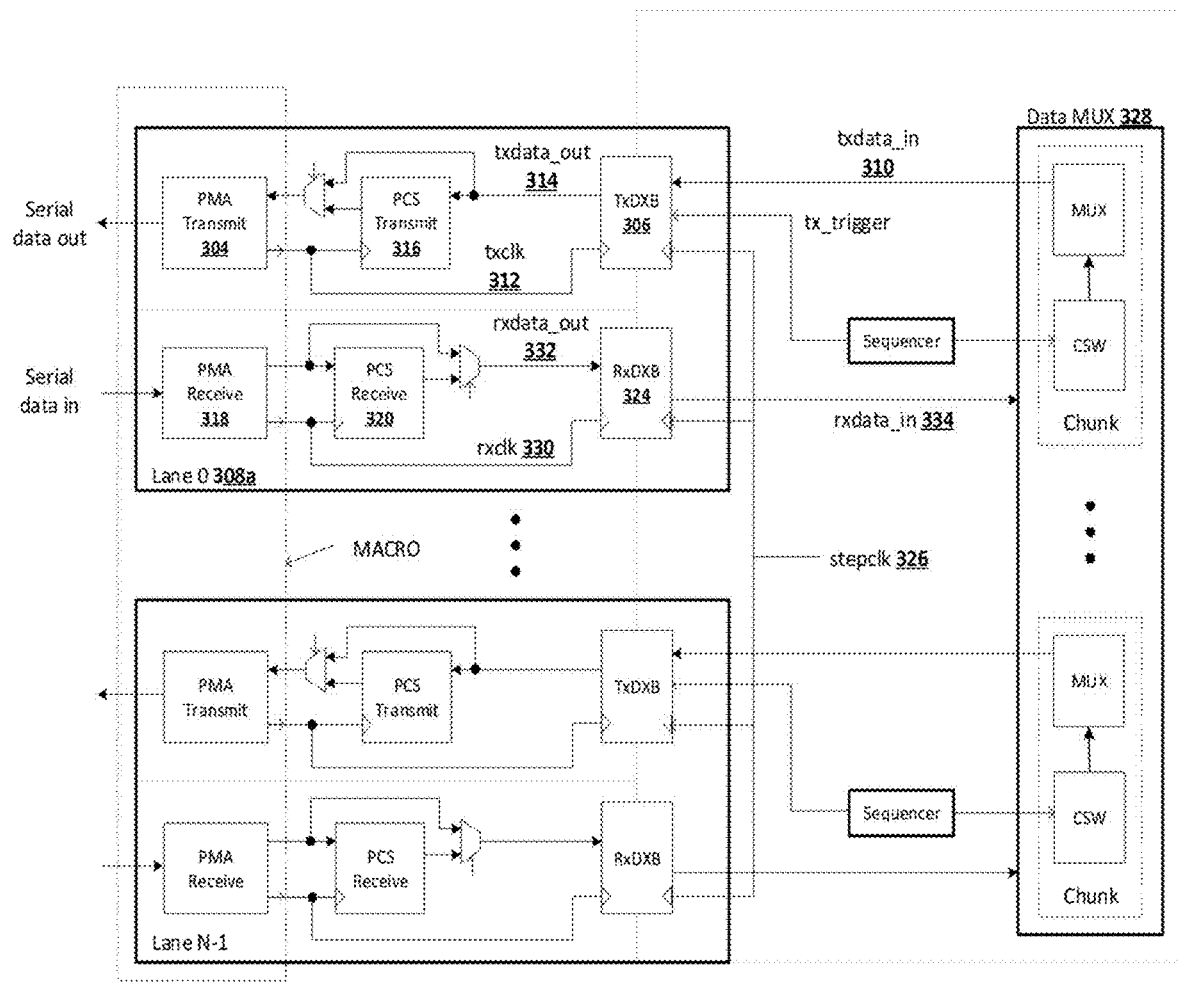
FIG. 3 shows an illustrative serializer-deserializer interface of an ASIC, according to an embodiment.

FIG. 3 shows an illustrative SerDes interface 300, according to an exemplary embodiment. The SerDes interface 300 may be in an emulation ASIC of an emulation system or at a switching ASIC of the emulation system. The SerDes interface 300 may have multiple data lanes (e.g., N lanes from lane 0 to lane N−1), out of which a first lane 308a (lane 0, as shown) has been labeled for reference. It should be understood that the description of the first lane 308a may apply the other lanes as well. However, it should be understood that the lanes may operate at different clock speeds. For example, lane 0 may be faster than lane N−1.

The first lane 308a in the SerDes interface 300 may include a transmit portion containing a physical media attachment transmit (PMA TX) macro 304 (also referred to as PMA TX 304), a physical coding sublayer transmit (PCS TX) component 316 (also referred to as PCS TX 316), and a dual port transmitter domain-crossing buffer (TxDXB) 306. The first lane 308a may further include a receive portion containing a physical media attachment receive macro (PMX RX) 318 (also referred to as PMA RX 318), a physical coding sublayer receive (PCS TX) component 320 (also referred to as PCS RX 320), and a dual port receiver domain-crossing buffer (RxDXB) 324.

The PMA TX 304 may include multi-link/multi-protocol logic block that may provide clock signal, reset signal, and/or power control signals to the transmit portion of the first lane 308a of the SerDes interface 300. For example, the PMA TX 304 may include a phase locked loop (PLL) that may provide txclk (transmit clock) signal 312 to the TxDXB 306. The txclk signal 312 may be a clock signal controlling the operation of the transmit portion of the first lane 308a. Therefore, the txclk signal 312 may determine the speed of operation of the transmit portion of the first lane 308a. For example, the txclk signal 312 may synchronize read operation from the TxDXB 306 which may contain input data txdata_in 310 written into the TxDXB using stepclk (step clock) signal 326 that may be the clock signal for the processing core (e.g., data multiplexer 328) of the ASIC containing the SerDes interface 300. In an embodiment, the PMA TX 304 may further include a read logic (not shown) that may read txdata_out 314 from the TxDXB 306. In another embodiment, the read logic may be a combination of logic circuits in one or more components of the transmit portion of the first lane 308a. The PCS TX 316 may encode txdata_out 314 into a suitable physical channel coding.

The TxDXB 306 may be a dual port hardware memory that may receive txdata_in (input data) from the stepclk signal 326 domain and provide txdata_out (output data) 314 in the txclk signal 312 domain. Therefore, TxDXB 306 may receive txdata_in 310 at a clock speed different from the clock speed that reads txdata_out 314. If the phases of the stepclk 326 and the txclk 312 are not tuned, there may either be a read error or a higher latency. A read error may occur when the txclk signal 312 triggers a read operation to read txdata_out 314 from the TxDXB 306 before the stepclk signal 326 triggers a write operation to write the txdata_in 310 to the TxDXB 306. A higher latency may occur when the txclk signal 312 triggers a read operation to read txdata_out 314 from the TxDXB 306 after a time lag from when the stepclk signal 326 triggers a write operation to write txdata_in 310 to TxDXB 306. The embodiments of systems and methods described herein may tune the phase of the txclk signal 312 in reference to the stepclk signal 326 such that there is a low latency between the write operation to the TxDXB 306 and the subsequent read operation from the TxDXB 306.

The PMA RX 318 may include multi-link/multi-protocol logic block that may provide clock signal, reset signal, and/or power control signals to the receive portion of the first lane 308a of the SerDes interface 300. For example, the PMA RX 318 may include a phase locked loop (PLL) that may provide rxclk (receive clock) signal 330 to the RxDXB 324. The rxclk signal 330 may be a clock signal controlling the operation of the receive portion of the first lane 308a. Therefore, the rxclk signal 330 may determine the speed of operation of the receive portion of the first lane 308a. For example, the rxclk signal 330 may synchronize write operation to write rxdata_out (input data) 332 to the TxDXB 324 that may then be read out as rxdata_in (output data) 334 by the processing core using the stepclk signal 326. The PCS RX 320 may decode rxdata_out 332 to reverse physical channel coding.

In some embodiments, it may not be desirable to tune the phase of rxclk signal 330 in reference to stepclk signal 326. The data received by the receive side may asynchronous and the processing core may consume the data as it is received. However, in cases where input data may arrive earlier in some lanes than others and the lane delays are known, it may be desirable to compile for performance rather than delay symmetry. For example, the first lane 308a (lane 0) may receive data from an emulation cycle (as indicated by a prefix) sooner than lane N−1 receives data from the same emulation system. In this case, data received by the first lane 308a, rxdata_out 332, may reside in the RxDXB 324 longer than necessary thereby increasing the latency at the receive side. To improve performance, the processing core may read the rxdata_in 334 from the RxDXB 324 without waiting for the data received by lane N−1. The processing core may read the data from the corresponding RxDXB as the data arrives at lane N−1.

However, in some embodiments, it may be desirable to measure the phase of the rxclk signal 330 during bring up time based on the latency of a connection interfacing the first lane 308a. A compiler or sequencer may schedule a transmission of data in the connection based on the latency and the phase of the rxclk signal 330 such that incoming data is written to and read from RxDXB 324 with minimal latency.

The emulation system may use a framing protocol to control the operation of the switching ASIC containing the SerDes interface 300. If the SerDes interface 300 receives an end-of-packet molecule, the switching ASIC may stop routing data through the SerDes interface 300. If the SerDes interface 300 receives a start-of-packet of molecule, the switching ASIC may resume routing data through the SerDes interface 300.

Figure 4:
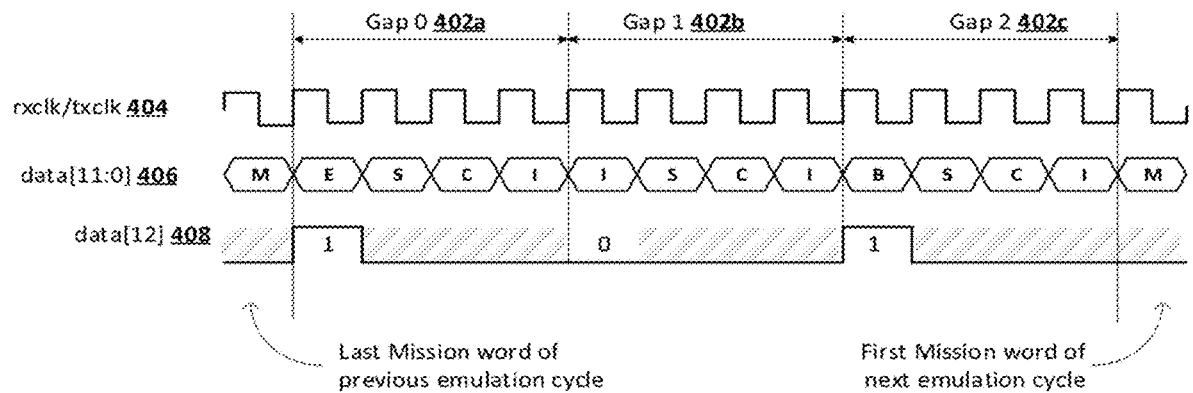
FIG. 4 shows illustrative signals and data packets of a framing protocol indicating gap cycles and emulation cycles in an emulation system, according to an embodiment.

FIG. 4 shows illustrative signals and data packets 400 of a framing protocol in an emulation system, according to an embodiment. The emulation system may generate the illustrative signals and data packets 400 during the gap cycles: gap cycle 0 402a, gap cycle 1 402b, gap cycle 2 402c (collectively or commonly referred to gap cycles 402 and gap cycle 402 respectively). During the gap cycles 402, the emulation ASICs of the emulation system may not generate and transmit mission data. Mission data may be useful data generated when the emulation system is emulating different portions of the DUT.

A synchronization subsystem in the emulation system, in coordination with a sequencer in each ASIC, may transmit a first indication to each of the emulation ASICs at the beginning of the first gap cycle 402a and a second indication to each of the emulation ASICs at the beginning of the third gap cycle 402c. Here, the third gap cycle 402c is the last gap cycle before the resumption of emulation cycles. Therefore, using the first indication, the sequencer may cause its respective emulation ASIC to stop generating and/or transmitting mission data related to their respective processes. Using the second indication, the sequencer may cause its respective emulation ASIC to resume the respective processes. However, the switching ASICs may be handling data of multiple processes at different SerDes interfaces and a single indication may not configure the switching ASIC to handle these different processes. Therefore, each of the SerDes interfaces may have to be configured differently for emulation cycles and the gap cycles 402.

Each of the gap cycles 402 may have the same period as a system clock cycle. Within a system clock cycle, SerDes interface clocks in a switching ASIC may have multiple cycles, typically four cycles to six cycles. The SerDes interface associated with the illustrative data packets and signals 400 may have four cycles of the receive clock (rxclk) signal and/or the transmit clock (txclk) signal 404. Therefore rxclk/txclk signal 404 may provide four time slots for four words during each of the gap cycles 402. The four time slots may be referred to as slot 0 (at first cycle of rxclk/txclk signal 404 within the system clock cycle), slot 1 (at second cycle of rxclk/txclk signal 404 within the system clock cycle), slot 2 (at third cycle of rxclk/txclk signal 404 within the system clock cycle), and slot 3 (at fourth cycle of rxclk/txclk signal 404 within the system clock cycle).

When the emulation system starts the first gap cycle 402a, the emulation system may send an indication to the emulation ASIC by de-asserting a signal (e.g., a dstep signal). Alternatively, the sequencer may infer the end of the emulation cycle by keeping track of the number of mission cycles since a previous assertion of a dstep signal based on a predetermined configuration for a particular job. For the switching ASIC routing data between different processes with different lane rates, it may not be possible to send a single indication to stop the routing. Therefore, each of the SerDes interfaces may have to be synchronized separate and apart from each other. The framing protocol as described herein provides such synchronization functionality such the switching ASIC receives indication of the beginning and ending of the gap cycles at each of the lanes.

In the four time slots of the rxclk/txclk signal 404 in the first gap cycle 402a, an ASIC (e.g., an emulation ASIC or a switching ASIC) may transmit data 406 of four words to indicate to the switching ASIC that the corresponding SerDes interface will not receive mission data during the gap cycles 402. Therefore the switching chip may not route the data 406 received at the corresponding SerDes interface until a different set of four words indicating beginning of mission cycles (or end of the gap cycles) are received. The four words indicating the beginning of gap cycles (or end of mission cycles) may include an end-of-packet word (E), a status word (S), a cyclic redundancy check word (C), and one or more idle words (I). This combination of four words may also be referred to as end-of-packet molecule.

The switching chip may receive the end-of-packet word at the first slot (slot 0) of the first gap cycle 402a. In some embodiments, to indicate the end-of-packet word, the emulation chip transmitting the data 406 may assert bit 12 408 of the data 406. The switching chip may receive the status word at slot 1 of each of the gap cycles 402. The status word may provide an in-band error forwarding capability by which a number of local errors may be forwarded to a next receiving device. The switching chip may receive the cyclic redundancy check word at slot 2 following the status word of each of the gap cycles 402. In some embodiments if the length of the status word is more than 12, then the lower 12 bits may provide the functionality of the cyclic redundancy check. There may be two modes of cyclic redundancy check operations: (i) stream mode and (ii) packet mode.

At the transmit side of the SerDes interface, a physical coding sublayer may enable a cyclic redundancy code calculation after sending a scramble prefix and keep updating the calculation in a stream mode or re-initialize the calculation after every cyclic redundancy code word in a packet mode. At the receive side of the SerDes interface, a physical coding sublayer may enable a cyclic redundancy calculation after receiving a scramble prefix and keep updating the calculation in a stream mode or reinitialize the calculation after receiving every cyclic redundancy code word in a packet mode. During the gap cycles 402, the transmit SerDes interfaces and receive SerDes interfaces of a plurality of chips may exchange cyclic redundancy code checksums and the receive SerDes interfaces may perform cyclic redundancy checks by comparing a received cyclic redundancy code word against the corresponding local checksum.

The idle word may be a time slot filler. The framing protocol may include idle words at slot 3 (the fourth time slot) of each of the first gap cycle 402a and the last gap cycle 402c if rxclk/txclk signal 404 has four cycles within the system clock cycle. If the rxclk/txclk signal 404 has six cycles within the system clock cycle, the framing protocol may include idle words at slot 3, slot 4, and slot 5 of each of the first gap cycle 402a and the last gap cycle 402c. For an intermediate gap cycle (gap cycle 402b in FIG. 4), the framing protocol may include idle word at slot 0 in addition to the later time slots, such as slot 3 when the rxclk/txclk signal 404 has four clock cycles and slot 3, slot 4, and slot 5 when the rxclk/txclk signal 404 has six clock cycles.

During the last gap cycle 402c, based on the framing protocol, a chip may transmit to the switching chip, a start-of-packet molecule including a start-of-packet word (B), a status word, a cyclic redundancy code word, and one or more idle words. The start-of-packet molecule may indicate the switching ASIC a resumption of emulation cycles during which the switching ASIC may receive mission words (M) to be routed to other chips.

Figure 5:
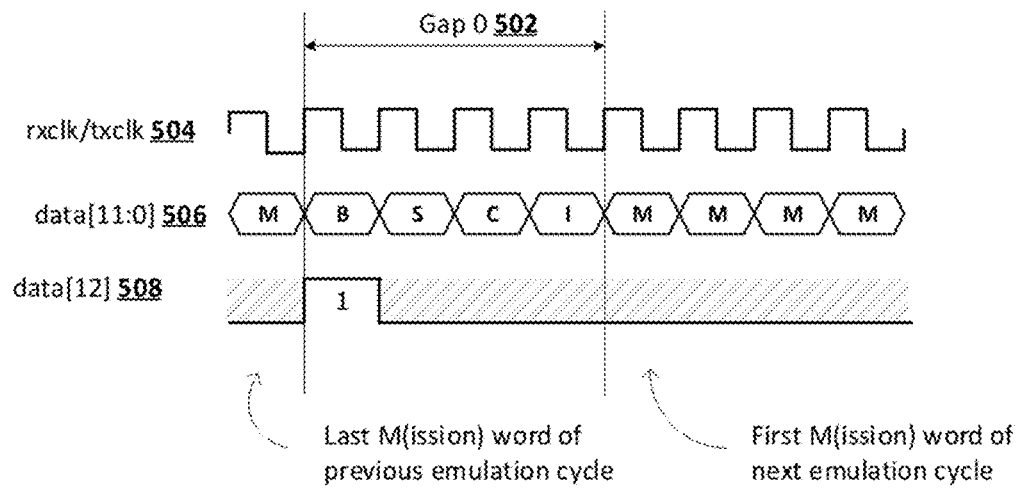
FIG. 5 shows illustrative signals and data packets of a framing protocol indicating gap cycles and emulation cycles in an emulation system, according to an embodiment.

FIG. 5 shows illustrative signals and data packets 500 indicating emulation cycles and a gap cycle of an emulation system. As shown, there may be a single gap cycle 502. When there is single gap cycle 502, there may be an overlap between a start-of-packet molecule and an end-of-packet molecule. In case of the overlap, the start-of-packet molecule may take priority and only the start-of-packet molecule may be generated by an ASIC and sent to switching ASIC. Therefore, data 506 received during the four cycles of the interface clock (rxclk/txclk) signal 504 may include a start-of-packet molecule containing a start-of-packet word (B), a status word (W), a cyclic redundancy check word (C), and an idle word (I). In the data 506, bit 12 508 may be asserted to indicate a start-of-packet word. There may be emulation cycles before and after the gap cycle 502 generating mission data (M).

Figure 6:
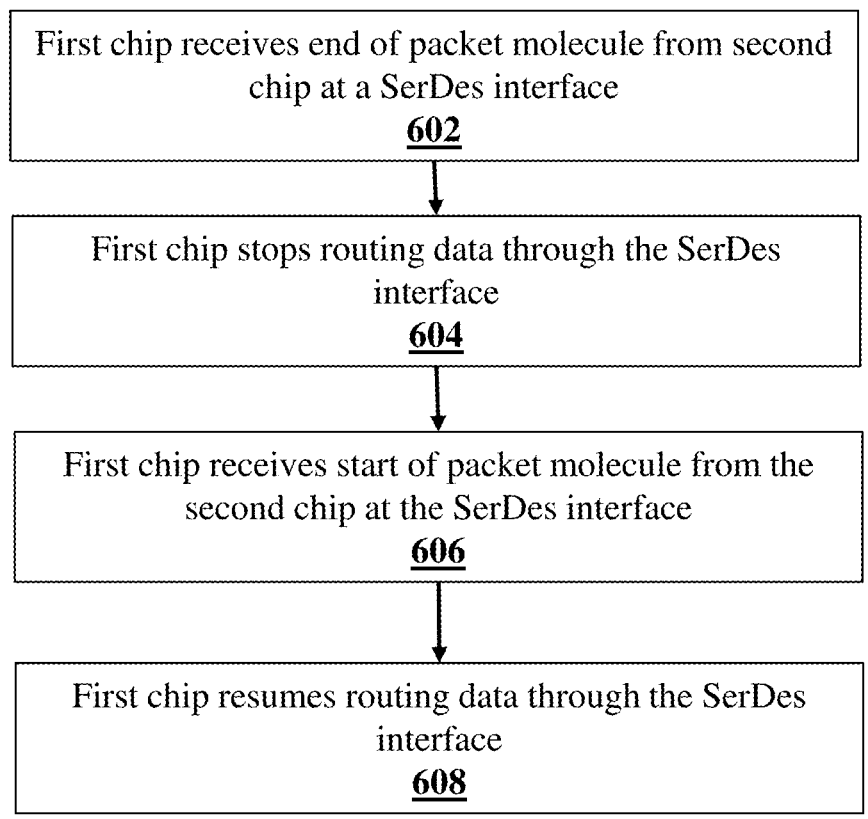
FIG. 6 shows a flow diagram of an illustrative method of using a framing protocol to indicate gap cycles and emulation cycles in an emulation system, according to an embodiment.

FIG. 6 shows a flow diagram of an illustrative method 600 of a framing protocol in an emulation system, according to an embodiment. It should be understood that the steps of the method 800 are merely illustrative and additional/alternative steps should be considered within the scope of this disclosure. Furthermore, one or more steps of the method 600 may be skipped altogether.

The method may begin at step 602 where a first chip may receive an end-of-packet molecule from a second chip at a SerDes interface. The first chip may be a switching chip configured to receive data from the second chip at the SerDes interface. The second chip may be an emulation chip that may receive an indication of a gap cycle from a sequencer of the emulation system. In response, the second chip may then transmit the end-of-packet molecule to the SerDes interface of the first chip.

At step 604, the first chip may stop routing data through the SerDes interface in response to receiving the end-of-packet molecule. As the emulation system is running a gap cycle, any data received at the SerDes interface may be non-mission data that need not be routed. Therefore, the first chip may not waste processing resources and power routing non-mission data.

At step 606, the first chip may receive start-of-packet molecule from the second chip at the SerDes interface. The second chip may have received an indication of resumption of emulation cycle from the sequencer of the emulation system. In response, the second chip may then transmit the start-of-packet molecule to the SerDes interface of the first chip.

At step 606, the first chip may resume routing data through the SerDes interface in response to receiving the start-of-packet molecule. The start-of-packet molecule may indicate the resumption of emulation cycles and the data received at the SerDes interface may be mission data. The resumption of routing data at the first chip enables routing of mission data as desired for a valid execution of the emulation cycles.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:
1. An emulation system comprising:
a first chip including a serialization-deserialization interface and configured to route data from a second chip to a set of chips;
the second chip including a sequencer, the sequencer configured to:

transmit an end-of-packet molecule from a plurality of words to the serialization-deserialization interface of the first chip at a first gap cycle of the emulation system;

transmit a start-of-packet molecule from the plurality of words to the serialization-deserialization interface of the first chip at a second gap cycle of the emulation system;

the first chip further configured to:

stop routing data through the serialization-deserialization interface to the set of chips in response to receiving the end-of-packet molecule; and resume routing data through the serialization-deserialization interface to the set of chips in response to receiving the start-of-packet molecule.

2. The emulation system according to claim 1, wherein the first chip is a switching chip.

3. The emulation system according to claim 1, wherein the second chip is an emulation chip.

4. The emulation system according to claim 1, wherein the second chip is a switching chip.

5. The emulation system according to claim 1, wherein the plurality of words of the end-of-packet molecule includes an end-of-packet word, a status word, a cyclic redundancy code word, and an idle word.

6. The emulation system according to claim 5, wherein the second chip is further configured to transmit the end-of-packet word at a first clock cycle of an interface clock of the first chip within a system clock cycle.

7. The emulation system according to claim 1, wherein the plurality of words of the start-of-packet molecule includes a start-of-packet word, a status word, a cyclic redundancy code word, and an idle word.

8. The emulation system according to claim 7, wherein the second chip is further configured to transmit the start-of-packet word at a first clock cycle of an interface clock of the first chip within a system clock cycle.

9. The emulation system according to claim 1, wherein the first gap cycle is same as the second gap cycle.

10. The emulation system according to claim 9, wherein the second chip is further configured to transmit only the start-of-packet molecule at the first gap cycle.

11. An emulation method comprising: transmitting, by a sequencer of a second chip to a serialization-deserialization interface of a first chip, an end-of-packet molecule at a first gap cycle of an emulation system, the end-of packet molecule including at least one of a plurality of selectable words; stopping, by the first chip, routing of data through the serialization-deserialization interface from the second chip to a set of chips in response to receiving the end-of-packet molecule; transmitting, by the second chip to the first chip, a start-of-packet molecule at a second gap cycle of the emulation, the start of packet molecule including at least one of a plurality of selectable words; and resuming, by the first chip, routing of data through the serialization-deserialization interface from the second chip to the set of chips in response to receiving the start-of-packet molecule.

12. The emulation method according to claim 11, wherein the first chip is a switching chip.

13. The emulation method according to claim 11, wherein the second chip is an emulation chip.

14. The emulation method according to claim 11, wherein the second chip is a switching chip.

15. The emulation method according to claim 11, wherein the plurality of words of the end-of-packet molecule includes an end-of-packet word, a status word, a cyclic redundancy check word, and an idle word.

16. The emulation method according to claim 15, further comprising:

transmitting, to the first chip by the second chip, the end-of-packet word at a first clock cycle of an interface clock of the first chip within a system clock cycle.

17. The emulation method according to claim 11, wherein the plurality of words of the start-of-packet molecule includes a start-of-packet word, a status word, a cyclic redundancy code word, and an idle word.

18. The emulation method according to claim 17, further comprising:

transmitting, to the first chip by the second chip, the start-of-packet word at a first clock cycle of an interface clock of the first chip within a system clock cycle.

19. The emulation method according to claim 11, wherein the first gap cycle is same as the second gap cycle.

20. The emulation method according to claim 19, further comprising:

transmitting, to the first chip by the second chip, only the start-of-packet molecule at the first gap cycle.

* * * * *